(12) United States Patent
Bushman et al.

(10) Patent No.: US 6,990,164 B2
(45) Date of Patent: Jan. 24, 2006

(54) DUAL STEERED FREQUENCY SYNTHESIZER

(75) Inventors: Michael L. Bushman, Hanover Park, IL (US); Lawrence E. Connell, Naperville, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 208 days.

(21) Appl. No.: 09/968,178

(22) Filed: Oct. 1, 2001

(65) Prior Publication Data

US 2003/0086519 A1 May 8, 2003

(51) Int. Cl.
*H03D 3/24* (2006.01)

(52) U.S. Cl. .......................... 375/376; 327/156; 455/260
(58) Field of Classification Search ................. 375/215, 375/294, 327, 354, 371, 373, 374, 375, 376; 455/260; 331/1 A, 1 R, 14, 15, 17, 18, 25; 327/141, 146, 147, 148, 155, 156, 157; 708/271
See application file for complete search history.

(56) References Cited

U.S. PATENT DOCUMENTS

| 4,667,170 A | | 5/1987 | Lofgren | |
|---|---|---|---|---|
| 4,755,774 A | * | 7/1988 | Heck | 332/123 |
| 4,952,889 A | * | 8/1990 | Irwin et al. | 332/128 |
| 5,142,246 A | * | 8/1992 | Petersson | 331/11 |
| 5,557,244 A | * | 9/1996 | Salvi | 332/128 |
| 5,602,514 A | | 2/1997 | Monk et al. | |
| 5,841,325 A | | 11/1998 | Knotts | |
| 6,016,332 A | * | 1/2000 | Smith et al. | 375/376 |
| 6,191,658 B1 | | 2/2001 | Fairbanks | |
| 6,285,640 B1 | | 9/2001 | Hayashi | |
| 6,389,092 B1 | * | 5/2002 | Momtaz | 375/376 |
| 6,472,914 B1 | * | 10/2002 | Gu et al. | 327/157 |
| 2001/0015677 A1 | | 8/2001 | Choi | |

FOREIGN PATENT DOCUMENTS

| FR | 0395109 A1 * | 10/1990 |
|---|---|---|
| TW | 271023 | 2/1996 |

OTHER PUBLICATIONS

Connell et al., "A CMOS Broadband Tuner IC," ISSCC 2002/Session 24/RF Systems/24.3, Solid–State Circuits Conference, Digest of Technical Papers, ISSCC, IEEE International, 3 pgs.

* cited by examiner

*Primary Examiner*—Chieh M. Fan
(74) *Attorney, Agent, or Firm*—Dillon & Yudell LLP

(57) ABSTRACT

A frequency synthesizer 100 comprising a charge pump 102, a loop filter 104, a loop divider 106, and an active and dual port VCO 110. An integrator 108 low pass filters a steering voltage to provide a low frequency path while the steering voltage provides a high frequency path. Both steering paths are connected to dual port VCO 110. The dual port VCO 110 is a single frequency generator which is controlled by two control signals. The dual port VCO 110, effectively provides the equivalent of a low frequency path 114 and a high frequency noise compensation path 112, both paths effectively merging 116 by superposition.

18 Claims, 3 Drawing Sheets

US 6,990,164 B2

DUAL STEERED FREQUENCY SYNTHESIZER

CROSS-REFERENCES TO RELATED APPLICATIONS

The present invention is related to U.S. patent application Ser. No. 09/968,171 entitled "Multiphase Controlled Voltage Controlled Oscillator" to Bushman et al., assigned to the assignee of the present invention and filed Oct. 1, 2001.

BACKGROUND OF THE INVENTION

1. Field of the Invention

The present invention is related to frequency synthesizers and, more particularly to closed loop frequency synthesizers with a wide operating frequency range.

2. Background Description

Frequency synthesizers, especially phase locked loop (PLL) synthesizers, may be required to operate over a wide frequency range. A typical PLL frequency synthesizer is a closed loop synthesizer that includes a voltage controlled oscillator (VCO) receiving a filtered steering line voltage that is generated by a charge pump, providing charges in response to frequency phase differences, i.e., between a reference frequency and the VCO output or some signal derived therefrom. The charge pump charges/discharges a capacitive load by passing a pumping charge (Q) to or from the load capacitor (C) to maintain a selected charge thereon as indicated by the desired quiescent voltage (V) across C. Since Q=CV, voltage across the load capacitor (C), is directly proportional to the charge on C. Thus, an active charge pump has three states: pumping charge onto the load; pumping charge off of the load; and neither, i.e., off. In its off state, the output of the charge pump must act as a high impedance (HiZ) similar to any well known three state driver.

Multi-band VCOs can be employed in frequency synthesizers to reduce the steering line voltage range required for the charge pump, but do not completely eliminate the above problems. Normally, the steering line voltage is again provided by a charge pump and filtered to control the frequency of the VCO. A simple example of a charge pump is a current source selectively connected to a load capacitance by a pair of independently controlled switches. The switches supply charge to or, remove charge from the capacitive load, by switching either or both of the switches on or off. Typically, the switches are transistors that do not switch on or off instantaneously, but involve some switching period during each reference cycle when both transistors are on. Any charge injection mismatch from the two switches, especially during switching, results in charge leakage to/from the load. This leakage causes an unintentional phase shift between the reference and loop frequencies. To compensate for this phase shift, the charge pump is turned on for a finite time during each cycle, which results in a voltage spur at the reference frequency and increases synthesizer inband noise because more charge pump noise is present.

Typical state of the art charge pumps can introduce significant switching noise and switching spur content into the frequency synthesizers. Reducing the operating range of the steering line voltage significantly reduces the noise but also constrains the design of the charge pump as well as reducing synthesizer operating range.

Thus, there is a need for a mechanism which reduces or eliminates charge pump related spur content and switching noise effects.

BRIEF DESCRIPTION OF THE DRAWINGS

The foregoing and other objects, aspects and advantages will be better understood from the following detailed preferred embodiment description with reference to the drawings, in which.

DETAILED DESCRIPTION OF A PREFERRED EMBODIMENT OF THE INVENTION

The present invention is a pseudo-third order, dual steering voltage synthesizer. Unlike a typical state of the art third order loop, the pseudo-third order dual steered frequency synthesizer of the present invention includes an additional pole and zero, which results from the availability of two steering voltage paths, a high frequency path and a low frequency path. The high frequency path compensates for high frequency side-band noise introduced into the synthesizer by the VCO and other functional blocks, e.g., the phase detector, dividers and in particular, the charge pump which adds noise while correcting for a phase error. The low frequency path is a primary path for setting the quiescent loop frequency and selecting the nominal frequency of the oscillator. Integrating the loop error voltage compensates for the low frequency noise in the synthesizer, or essentially, the quiescent frequency. Thus, for the preferred embodiment, the loop error voltage at the charge pump output may be set to any desired quiescent voltage, by requiring only that it compensate the higher frequency noise of the VCO and other functional blocks. This provides an advantage over prior art synthesizers, significantly reducing spurious and inband noise to improve performance and provide a fixed steering voltage for the loop filter.

Figure 1:
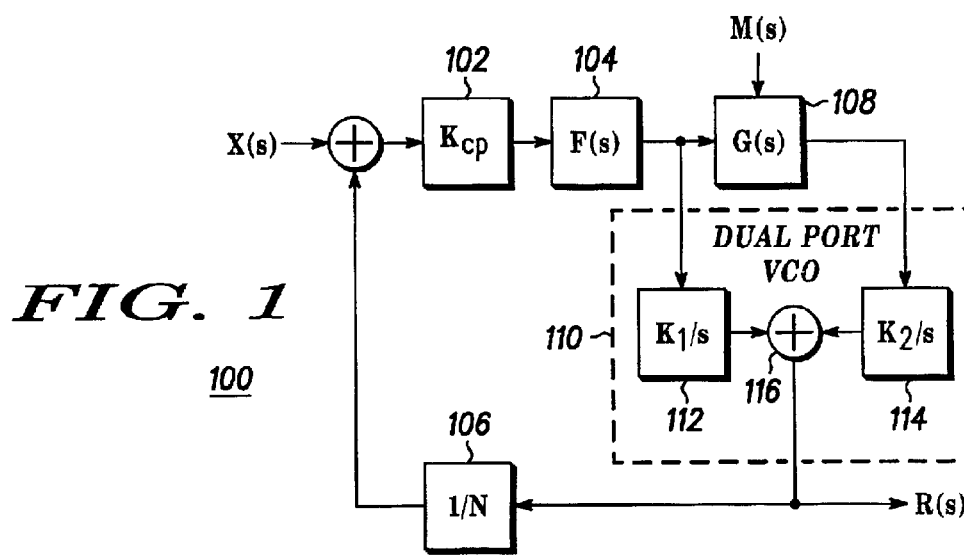
FIG. 1 shows a block diagram of a preferred embodiment synthesizer.

FIG. 1 is a block diagram model of a preferred embodiment synthesizer 100 according to the present invention which includes a charge pump 102, a loop filter 104, a loop divider 106, an integrator 108 and a dual port VCO 110. In addition to the noise normally found in a third order loop, the preferred embodiment introduces integrator noise referred to and represented by input noise source M(s). This introduced noise can be controlled and designed to be below the noise level of the synthesizer. Thus, using superposition the dual port VCO 110 model includes a low frequency path through block 114 and a high frequency noise compensation path through block 112. Although blocks 112 and 114 are representative only and do not generate individual separate frequencies that are combined in a block 116, the result is identical with the resultant composite frequency including the combined components of both the low and high frequency compensation paths.

Figure 2:
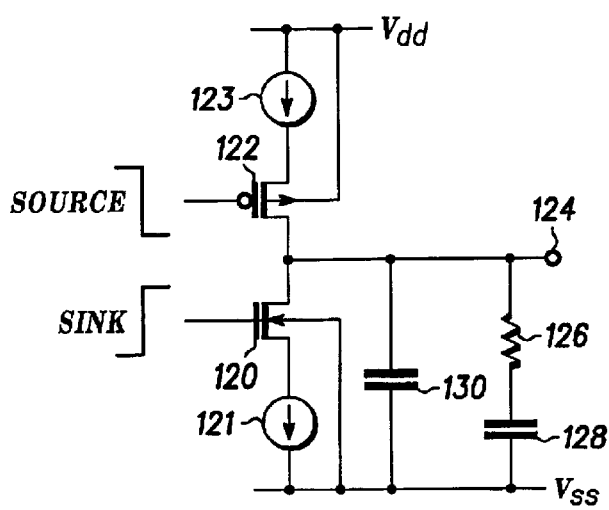
FIG. 2 shows an example of a simple three-state field effect transistor (FET) charge pump loaded by a loop filter.

FIG. 2 shows a simple three-state field effect transistor (FET) charge pump 102 loaded by a loop filter 104 that may be made in the complementary insulated gate FET technology commonly referred to as CMOS. The charge pump 102 includes an n-type FET (NFET) 120 as a p-type FET (PFET) 122. Matched current sources 121, 123 are included to supply charge to the load. Current source 121 is connected between the source of NFET 120 and negative supply voltage ($V_{ss}$), typically ground. Current source 123 is connected between the source of PFET 122 and positive supply voltage ($V_{DD}$). The NFET 120 is connected, drain to source, between the output 124 of the charge pump 102 and current source 121. The PFET 122 is connected, drain to source, between the output 124 and current source 123. The gate of both NFET 120 and PFET 122 are individually driven depending on whether charge is being provided to the load, drawn from the load or, if no charge is being pumped. The charge pump 102 is loaded by the loop filter 104, represented in FIG. 2 by series resistor (R) 126 and capacitor ($C_1$) 128 and parallel load capacitor ($C_2$) 130. Accordingly, in this example, $$F(S) = \left[ sC_2 + \frac{sC_1}{1 + sRC_1} \right]^{-1}.$$

So, FETs 120, 122 act as switches, selectively switching current from current sources 121, 123, respectively, to the load which includes loop filter resistor 126 and capacitors 128, 130. Ideally, if there is no phase error both switches turn on and off simultaneously and the net charge into the load is zero. However, when there is a phase mismatch, current is passed to/from current sources 121, 123 the portion of the cycle during which current is passed depends upon the mismatch, i.e., the phase error. The phase error period during which the particular current source 121, 123 is switched in, i.e., connected to the load 126, 128, 130, determines the amount of charge pumped to/from the load 126, 128, 130. Since the output charge is the output current times the phase error fraction of the period. The switching time of transistors 120 and 122 do not allow for accurate charge output when the phase error is small, therefore both switches are turned on once every cycle and the difference in the on times of each switch allows for very small charge output with small phase error. Ideally, also the switches have matched parasitic capacitances so that when the load voltage is at one half the positive supply voltage, the charge transferred by the switches is equal and opposite, thereby canceling the net charge into the load, i.e., net charge is zero. Unfortunately, for prior art frequency synthesizers due to the parasitic capacitances of the switches and their control voltages there is a transfer of charge to the load when both switches are operated simultaneously. When the load voltage is not at one half the positive supply voltage, an asymmetric charge is transferred by the switches and with a resultant net charge being transferred to the load. That net charge unintentionally shifts phase between the loop frequency and the reference frequency, which is a phase error that must be compensated each loop cycle. This error compensation generates a reference spur and adds oscillator noise.

As described hereinabove, NFET 120 and PFET 122 act as switches for tri-stating, sourcing or sinking current between current sources 121, 123 and the loop filter 104. A digital switching signal provided to the gates of each of NFET 120 and PFET 122 determines whether either is open or closed. When the loop is locked and in phase, the gate voltages of the FET switches transition synchronously such that NFET 120 and PFET 122 turn on and off simultaneously and, the loop filter output 104 remains at its steady state quiescent voltage. In prior art frequency synthesizers, the loop filter voltage determined the synthesizer quiescent output frequency, and therefore, the loop filter voltage could be set virtually anywhere between the negative supply voltage and the positive supply voltage. With this wide voltage range, the switched charge from switches 120 and 122 could not be matched in prior art frequency synthesizers and so, as noted above, switching noise was injected at each gate voltage transition and spur content was added, inadvertently, during each transition. By contrast, the present invention avoids spur content by providing high and low frequency compensation paths through a dual port VCO. The high frequency compensation path (which is the loop filter voltage) can be fixed at one half of the positive supply voltage where it is only a very small high frequency voltage that compensates for noise from the VCO and other functional blocks of the synthesizer. The low frequency compensation path through integrator 108 performs the function of the setting the quiescent frequency of the synthesizer instead of by varying the loop filter voltage as in the prior art. Thus, advantageously the charge from switches 120 and 122 is matched and unintentional spur and noise components are eliminated.

Current sources 121, 123 may be any appropriate cuent source providing a suitable current. Thus, for example, current source 121 may be an NFET (not shown) biased with its gate to source voltage ($V_{GS}$) slightly above its threshold voltage ($V_T$) to remain in saturation during normal charge pump operation, i.e., such that $V_{DS} \geq V_{GS} - V_T$, when NFET 120 is turned on. Likewise current source 123 may be a PFET (not shown) biased such that $V_{SD} \leq V_{SG} + V_T$ when PFET 122 is turned on. Ways of providing such bias conditions are well known, e.g., using an FET current mirror configuration.

The size of current source devices determines the linear operating range of the charge pump. When the output voltage range of the charge pump is large, the saturation voltage of the devices $V_{dsat}$ must be small if the current source devices are to remain in saturation.

$$V_{dsat} = \sqrt{\frac{2\pi}{\mu c_0 w}}$$

$$\text{where} \left( I = \frac{dQ}{dt} \right).$$

Saturation voltage is proportional to the square root of the device length to width ratio. The thermal noise of the current source devices and, therefore, charge pump noise is proportional to the square root of device width to length ratios.

$$gm = \sqrt{\frac{2I\mu c_0 w}{l}}$$

Accordingly, a design trade-off must be made between operating range and acceptable noise level. With the operating range minimized and the psuedo third order loop's charge pump output set to VDD/2, the noise performance can also be improved.

Thus, as noted above, for many applications the synthesizer 100 must generate a wide range of frequencies and, since the VCO frequency is controlled by the loop filter voltage, the loop filter voltage will not be one half of its positive supply voltage. The dual steered synthesizer eliminates switching noise and spur content by generating a quiescent steering voltage that is provided directly to the dual band VCO 110 and by extracting a high frequency compensating steering voltage with a DC value fixed at one half of the supply.

Figure 3A:
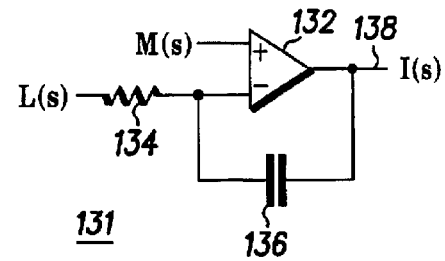
FIGS. 3A–B are examples of integrators.

FIG. 3A is an example of a simple integrator 131 which may be used for integrator 108. The simple integrator 131 includes a differential amplifier 132, a resistor 134 at the negative input to the amplifier 132 and a capacitor 136 between the negative input and the amplifier output 138. The filtered output 124 of charge pump 102 is provided to resistor 134 as well as dual port VCO 110. A bias voltage is provided to the positive input of amplifier 132 which determines the DC loop filter voltage. The amplifier output 138 is the other input to the dual port VCO 110. Intrinsic noise, represented by M(s) in the differential amplifier 132, and shown for modeling convenience is provided to the input of the amplifier 132.

Figure 3B:
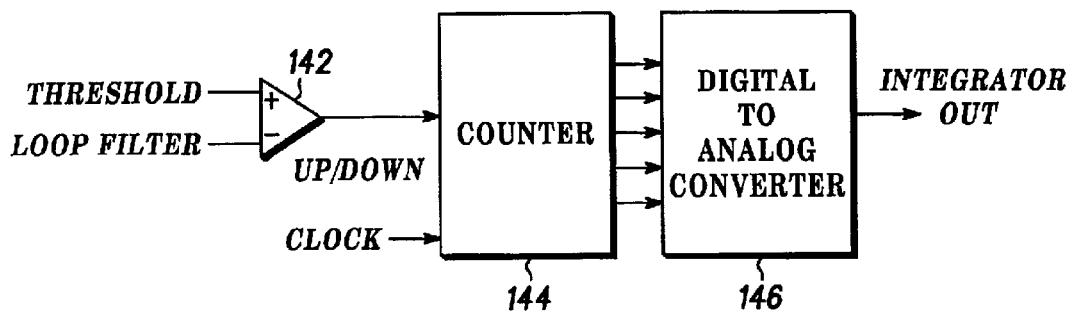

FIG. 3B is an alternative digital integrator 140. The digital integrator 140 includes a comparator 142, an up/down counter 144 and a digital to analog converter (DAC) 146. The comparator 142 receives the loop filter output 124 which is compared against a threshold voltage. The output of the comparator 142 is provided to the up/down input of the up/down counter 144, which is clocked by an independent block signal. The output of the up/down counter 144 is provided to the DAC 146 input. The DAC 146 output is the output of integrator 108 provided to dual port VCO 110.

The comparator 142 determines whether the dynamic steering line voltage at the loop filter output 124 is above or below the desired charge pump quiescent output. Depending upon the comparator output, the integrator integrates up or down at the clock rate. The digital count value is converted to a voltage by DAC 146 to adjust the quiescent frequency. Clock rate and DAC step size determine the integrator constant.

This alternate integrator 140 produces a low level tone in the quiescent frequency path at the integrator update rate which is removed in the high frequency compensation path. Additionally, the clock rate of the integrator can be dithered to spread the power in the tone or, the clock can be stopped when desired. An advantage of the digital integrator is that the steering line noise voltage is a function of the DAC 146, which may be implemented as a resistor network. A suitable bypass capacitor (not shown), compatible with the integrator's time constant can be included to reduce the resistor network noise and smooth update transitions.

Figure 4:
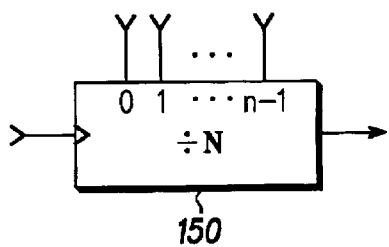
FIG. 4 shows an example of a programmable divide by N register loop divider.

FIG. 4 shows an example of a loop divider 106 which, in this example is a programmable divide by N register 150. The divide by N register 150 may be a generic, programmable register with N selectively provided as necessary. Alternately, N may be hard wired into the register or, the register may be designed to divide by a selected value.

Figure 5:
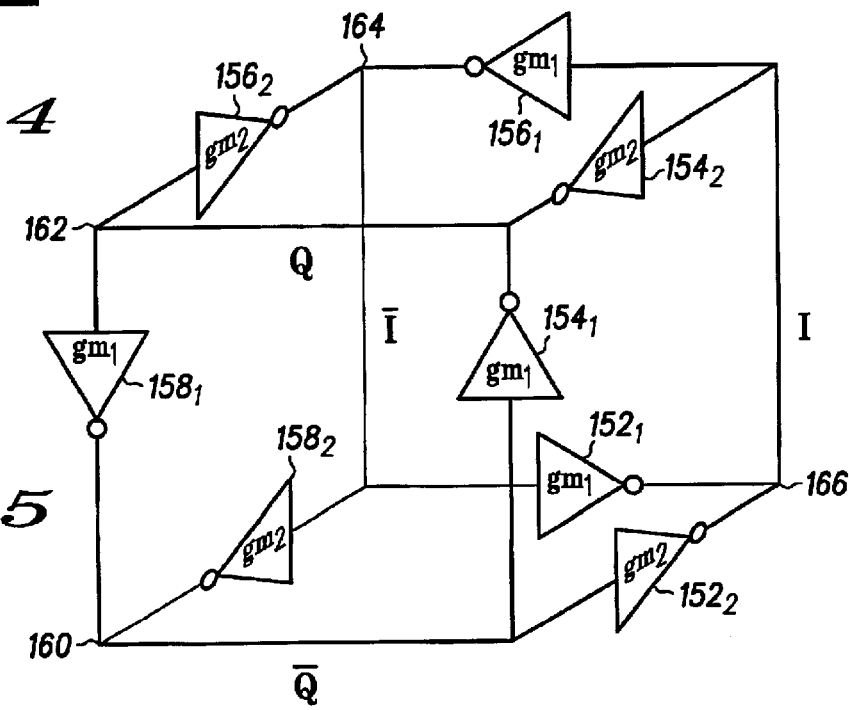
FIG. 5 is an example of a dual port quadrature VCO.

FIG. 5 is an example of a dual port quadrature VCO 110, which is described in further detail in U.S. Pat. No. 09/968, 171 to Bushman et al., entitled "Multiphase Voltage Controlled Oscillator" assigned to the assignee of the present invention and incorporated herein by reference. Bushman et al. teaches a VCO that provides two pair of complementary quadrature phases. Each pair of controllable transconductance inverting amplifiers 152, 154, 156, 158. Thus, each pair 152, 154, 156, 158 provides a respective current amplitude and phase which is summed at the respective individual output 160, 162, 164, 166 as described in detail in Bushman et al.

Figure 6A:
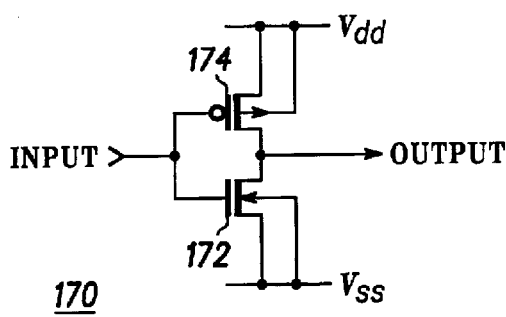
FIGS. 6A–B show examples of controllable transconductance inverting amplifiers which may be paired to form a dual port VCO as in FIG. 5.
Figure 6B:
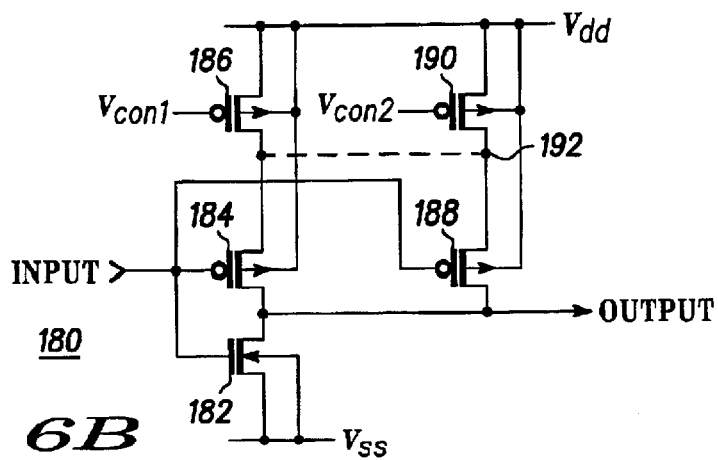

FIGS. 6A–B show examples of controllable transconductance inverting amplifiers which may be combined as pairs 152, 154, 156 and 158 to form dual port VCO 110 as in FIG. 5. FIG. 6A shows a simple inverter 170 that includes NFET 172 and PFET 174. The source of the NFET 172 is connected to a low or negative supply voltage, e.g., ground, $V_{low}$ or $V_{ss}$. The source of the PFET 174 is connected to a high or positive supply voltage, $V_{hi}$ or $V_{dd}$. The drain of the NFET 172 is connected to the drain of PFET 174 at the inverter output 176. The input to the inverter is connected to the common connection of the gate of NFET 172 and the gate of PFET 174. Transconductance of this inverter 170 may be varied by varying supply voltages and, in particular, $V_{dd}$.

FIG. 6B shows a second controllable transconductance inverting amplifier 180. NFET 182 corresponds to NFET 172. However, this controllable transconductance inverting amplifier 180 includes two series pair of PFETs 184, 186 and 188, 190 in parallel, between $V_{dd}$ and the output. The output trnsconductance is controlled by two separate transconductance control bias voltages $V_{CON1}$ and $V_{CON2}$ connected to the gate of each of PFETs 186, 190, respectively. Optionally, the connection point between PFETs 184 and 186 may be connected to the connection point 192 between PFETs 188 and 190. With that optional connection, PFETs 184 and 188 may be replaced by a single PFET (not shown).

Thus, the dual port VCO 110 may be constructed using simple inverters 170 for controllable $gm_1$ amplifiers 150$_1$, 152$_1$, 154$_1$ and 156$_1$, and second controllable transconductance inverting amplifiers 180 for controllable $gm_2$ amplifiers 150$_2$, 152$_2$, 154$_2$ and 156$_2$. In this example, the charge pump output 124 is provided as $V_{CON1}$ and the output of integrator 108 is provided as $V_{CON2}$. One output phase 160, 162, 164 or 166 is fed back through divider 106 and the result is compared against input reference X(s).

The loop equation for the synthesizer block is given as follows:

$$R(s) = \left[X(s) - \frac{R(s)}{N}\right] K_{cp} F(s) \left[\frac{K_1}{s} + \frac{K_2}{s} G(s)\right] + M(s) \frac{K_2}{s} G^i(s)$$

Where $G^i(s)$ is an internal transfer function for the noise of the active integrator 108. Loop filter will be third order and the poles and zero will be selected with a symmetrical split as:

$$F(s) = A \times \frac{\left(s + \frac{\omega_c}{x}\right)}{s(s + x\omega_c)}$$

and the transfer function for the integrator 108 is $$G(s) = \frac{1}{s} \times \frac{\omega_c}{ax}$$

Solving for the loop fumction response R(s) to input X(s) gives $$R(s) = \frac{K_{cp} F(s) \frac{K_1}{s}\left[1 + \frac{K_2}{K_1} G(s)\right]}{1 + \frac{(K_{cp} F(s))K_1}{sN}\left[1 + \frac{K_2}{K_1} G(s)\right]} \times X(s) +$$

$$\frac{\frac{K_2}{s} \times G^i(s)}{1 + \frac{(K_{cp} F(S))K_1}{sN}\left[1 + \frac{K_2}{K_1} G(s)\right]} x M(s)$$

Ignoring the noise at the output due to M(s) the loop transfer from excitation, X(s), to response, R(s) can be considered. If the unity gain frequency for the third order loop is used where $$x\omega_c^2 = \frac{K_{cp}K_1 A}{N}$$

The closed loop transfer function becomes $$\frac{R(s)}{X(s)} = \frac{Nx\omega_c^2\left[\left(s + \frac{\omega_c}{x}\right)\left(s + \frac{K_2}{K_1}\frac{\omega_c}{ax}\right)\right]}{s^4 + s^3(x\omega_c) + s^2(x\omega_c^2) + s\left(\left(1 + \frac{K_2}{K_1}\frac{1}{a}\right)\omega_c^3\right) + \left(\left(1 + \frac{K_2}{K_1}\frac{1}{ax}\right)\omega_c^4\right)}$$

The transfer function for a conventional third order loop is $$= \frac{Nx\omega_c^2\left[\left(s + \frac{\omega_c}{x}\right)\right]}{s^3 + s^2(x\omega_c) + s^1(x\omega_c^2) + \omega_c^3}$$

However, the preferred embodiment is a fourth order loop and has an additional zero at $$\text{zero} = \frac{K_2}{K_1}\frac{\omega_c}{ax}$$

Thus, by constraining the gain of integrator 108 (constant α) to be much larger than ratio of $K_2$ to $K_1$, the $4^{th}$ order transfer function limit can be approximated as $$\lim_{\frac{K_2}{K_1}\frac{\omega_c}{ax} \to 0} \frac{R(s)}{X(s)} \cong \frac{Nx\omega_c^2\left[\left(s + \frac{\omega_c}{x}\right)\left(s + \frac{K_2}{K_1}\frac{\omega_c}{ax}\right)\right]}{(s^3 + s^2(x\omega_c) + s(x\omega_c^2) + \omega_c^3)\left(s + \frac{K_2}{K_1}\frac{\omega_c}{ax}\right)}$$

For the additional pole and zero to cancel they must be sufficiently lower in frequency than the open loop zero for a third order loop and then $$\frac{R(s)}{X(s)} \cong \frac{Nx\omega_c^2\left[\left(s + \frac{\omega_c}{x}\right)\right]}{(s^3 + s^2(x\omega_c) + s(x\omega_c^2) + \omega_c^3)} \text{ if } a \gg \frac{K_2}{K_1}$$

Constraining the gain of the integrator G(s) with respect to the ratio of the port sensitivities of the VCO allows a third order approximation for the loop.

The circuit for the integrator is shown in FIG. 3A. The reference voltage at the non-inverting input will set the quiescent loop filter voltage for the synthesizer. The noise of the active circuit will be lumped at this input for analysis of its contribution to overall synthesizer noise.

The transfer function for the loop input L(s) of integrator 108 is $$G(s) = \frac{1}{s} \times \frac{\omega_c}{ax} = \frac{1}{s} \times \frac{1}{RC}$$

For the internal noise source, M(s), the transfer function is $$G^i(s) = -\frac{\left(s + \frac{\omega_c}{ax}\right)}{s}$$

From the original loop response equation the transfer function of the noise, M(s) is then $$\frac{R(s)}{M(s)} = \frac{\frac{K_2}{s} \times G^i(s)}{1 + \frac{(K_{cp}F(s))K_1}{sN}\left[1 + \frac{K_2}{K_1}G(s)\right]}$$

$$= \frac{-K_2\left[s(s + x\omega_c)\left(s + \frac{\omega_c}{ax}\right)\right]}{s^4 + s^3(x\omega_c) + s^2(x\omega_c^2) + s\left(\left(1 + \frac{K_2}{K_1}\frac{1}{a}\right)\omega_c^3\right) + \left(\left(1 + \frac{K_2}{K_1}\frac{1}{ax}\right)\omega_c^4\right)}$$

Under the gain constraint for G(s) to approximate the third order loop, the transfer function for the noise associated with M(s) is $$\frac{R(s)}{M(s)} \cong \frac{-K_2\left[s(s + x\omega_c)\left(s + \frac{\omega_c}{ax}\right)\right]}{(s^3 + s^2(x\omega_c) + s(x\omega_c^2) + \omega_c^3)\left(s + \frac{K_2}{K_1}\frac{\omega_c}{ax}\right)}$$

Figure 7:
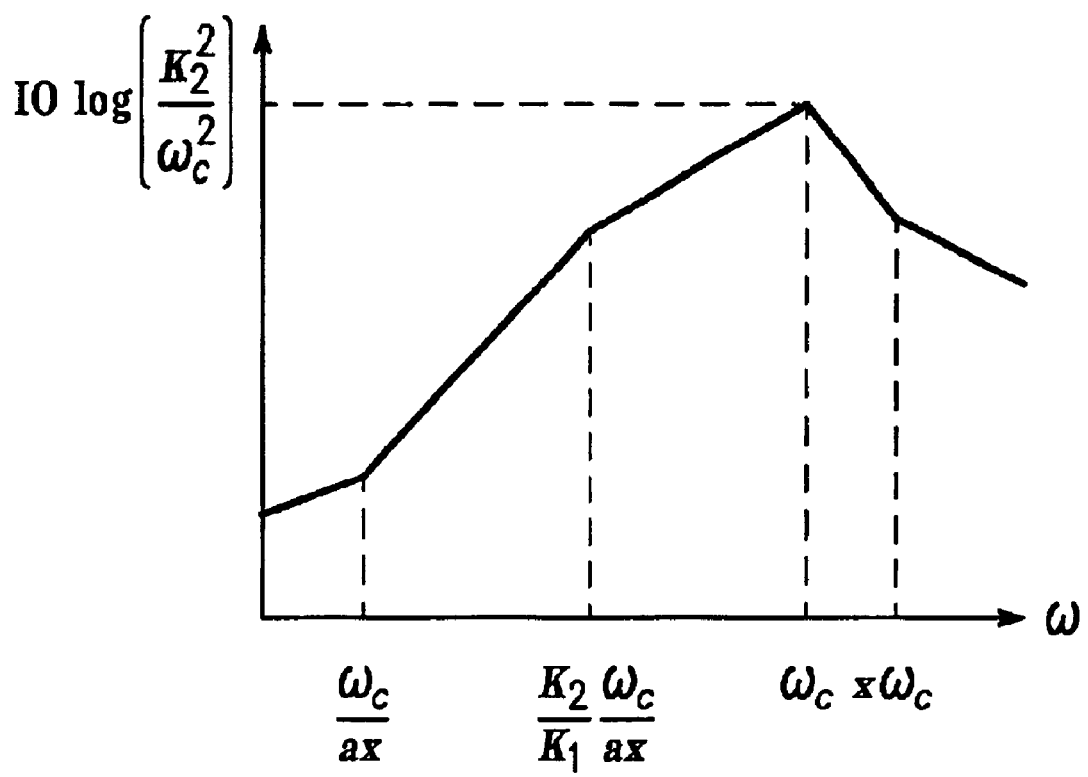
FIG. 7 is a Bode Plot of phase noise introduced into the synthesizer by the integrator of FIG. 3A.

FIG. 7 is a Bode plot of this function which has 4 poles and three zeros. The synthesizer phase noise associated with the integrator peaks at the corner frequency for the loop filter. The magnitude of the phase noise $$\left|\frac{R(s)}{M(s)}\right|^2$$

at the peak is $$\left|\frac{R(s)}{M(s)}\right|^2 \cong \frac{K_2^2\left[(-s^2)(-s^2 + x^2\omega_c^2)\left(-s^2 + \left(\frac{1}{ax}\right)^2\omega_c^2\right)\right]}{[-s^2 + \omega_c^2]^3\left[-s^2 + \left(\frac{K_2}{K_1}\frac{1}{ax}\right)^2\right]}$$

$$\left|\frac{R(\omega_c)}{M(\omega_c)}\right|^2 \cong \frac{K_2^2}{\omega_c^2} \times \frac{\left[(1 + x^2)\left(1 + \left(\frac{1}{ax}\right)^2\right)\right]}{2^3\left[1 + \left(\frac{K_2}{K_1}\frac{1}{ax}\right)^2\right]}$$

$$\left|\frac{R(\omega_c)}{M(\omega_c)}\right|^2 \cong \frac{K_2^2}{\omega_c^2} \times \frac{[(1 + x^2)]}{2^3} \text{ if } a \gg \frac{K_2}{K_1}$$

The assumption that $K_{2>K_1}$ is reasonable since the $K_2$ port needs to move the VCO to its quiescent frequency, while the $K_1$ port only needs enough sensitivity to eliminate the VCO noise. The pole-zero splitting coefficient, X, is related to the loop damping constant as $$\zeta = \frac{x - 1}{2}.$$

For optimal lock time the damping constant, ζ, is 0.875 and the peak value of noise at the corner frequency is the same as if M(s) was applied directly to the $K_2$ VCO input and lower everywhere else. The noise varies only a couple dB for reasonable values of x.

Thus, the new synthesizer topology utilizes an additional pole and zero provided by an active integrator to generate a quiescent steering voltage to set the nominal frequency. This requires only that the loop filter compensate higher frequencies and allows the loop filter voltage to be fixed at any desired nominal voltage.

While the invention has been described in terms of preferred embodiments, those skilled in the art will recognize that the invention can be practiced with modification within the spirit and scope of the appended claims.

We claim:

1. A frequency synthesizer comprising:
   a charge pump receiving a difference signal and providing an error compensation charge sample in response to said difference signal;
   loop filter filtering said error compensation charge sample to provide a control voltage;
   a dual port voltage control oscillator (VCO) receiving said control voltage from said loop filter, wherein said dual port VCO comprises at least one pair of transconductance inverting amplifiers cross coupled and providing at least a pair of complementary outputs;
   an integrator comparing said control voltage to a reference voltage and providing an integrated error compensation voltage to said dual port VCO in response to said comparison, said dual port VCO providing an output frequency determined by said control voltage and said integrated error compensation voltage; and
   a frequency divider dividing said output frequency by at least unity, said difference signal resulting from an input reference signal being combined with said divided frequency.

2. A frequency synthesizer as in claim 1 wherein said dual port VCO comprises:
   a first pair of voltage controllable transconductance inverting amplifiers cross coupled and providing a first pair of complementary outputs;
   a second pair of voltage controllable transconductance inverting amplifiers cross-coupled and providing a second pair of complementary outputs said second pair of complementary outputs being ninety degrees out of phase with said first pair of complementary outputs;
   a third pair of voltage controllable transconductance inverting amplifiers connected in series between outputs of said first pair, an output of said second pair connected between said third pair; and
   a fourth pair of voltage controllable transconductance inverting amplifiers connected in series between outputs of said second pair, an output of said first pair being connected between said fourth pair, transconductance of amplifiers in said first and second pair being controlled by a first control voltage and transconductance of amplifiers in said third and fourth pair being controlled by a second control voltage.

3. A frequency synthesizer as in claim 2, wherein two pair of controllable transconductance inverting amplifiers in said dual port VCO are pairs of inverters, transconductance of said pairs of inverters being controlled by adjusting an inverter supply voltage.

4. A frequency synthesizer as in claim 3, each of said controllable transconductance inverting amplifiers in said dual port VCO comprising:
   a first field effect transistor (FET) connected between a high supply voltage Vhi and an inverting output, said first FET being a p-type FET (PFET); and
   an n-type FET (NFET) connected between a low supply voltage and said inverting output.

5. A frequency synthesizer as in claim 4, wherein two other pair of said controllable transconductance inverting amplifiers further comprise:
   a second PFET connected between Vhi and said first PFET, said filtered control voltage being provided to a control gate of said second PFET;
   a third and fourth PFET connected in series and between Vhi and said output, said noise difference voltage being provided to a control gate of said fourth PFET; and
   a VCO phase being connected to a control gate of said NFET, said first PFET and said third PFET.

6. A frequency synthesizer as in claim 5 wherein said integrator comprises:
   a differential amplifier;
   a capacitor connected between said differential amplifier output and a negative input to said differential amplifier; and
   a resistor connected between an input to said integrator and said negative input of said differential amplifier, an output of said differential amplifier being the output of said integrator.

7. A frequency synthesizer as in claim 5 wherein said integrator comprises:
   a comparator comparing said filtered control voltage against a threshold voltage;
   an up/down counter receiving an output of said comparator, said up/down counter incrementing or decrementing in response to said comparator output; and
   a digital to analog converter converting a count output of said up/down counter to an integrator output voltage.

8. A frequency synthesizer as in claim 5 wherein said loop filter comprises:
   a series resistor and capacitor (RC) connected between an output of said charge pump and a reference voltage; and
   a capacitor in parallel with said series RC.

9. A frequency synthesizer as in claim 8 wherein said charge pump comprises:
   a first current source providing a first current for pumping charge to said loop filter;
   a PFET selectively connecting said first current source to said loop filter;
   a second current source providing a second current for pumping charge from said loop filter; and
   a NFET selectively connecting said second current source to said loop filter, whereby said charge pump maintains said filtered control voltage at said loop filter.

10. A closed loop frequency synthesizer comprising:
    a charge pump receiving a difference signal and providing an error compensation charge sample in response to said difference signal;
    a loop filter filtering said error compensation charge sample to provide a control voltage;
    a dual port voltage control oscillator (VCO) receiving said control voltage from said loop filter, said dual port VCO comprising:
    a first pair of voltage controllable transconductance inverting amplifiers cross coupled and providing a first pair of complementary output,
    a second pair of voltage controllable transconductance inverting amplifiers cross-coupled and providing a second pair of complementary outputs, said second pair of complementary outputs being ninety degrees out of phase with said first pair of complementary outputs,
    a third pair of voltage controllable transconductance inverting amplifiers connected in series between outputs of said first pair, an output of said second pair connected between said third pair, and
    a fourth pair of voltage controllable transconductance inverting amplifiers connected in series between outputs of said second pair, an output of said first pair being connected between said fourth pair, transconductance of amplifiers in said first and second pair being controlled by a first control voltage and transconductance of amplifiers in said third and fourth pair being controlled by a second control voltage;

an integrator comparing said control voltage to a reference voltage and providing an integrated error compensation voltage to said dual port VCO in response to said comparison, said control voltage and said integrated error compensation voltage controlling transconductance in two pair of said voltage controllable transconductance amplifiers, said dual port VCO providing an output frequency determined by said control voltage and said integrated error compensation voltage; and a frequency divider dividing said output frequency by at least unity, said difference signal resulting from an input reference signal being combined with said divided frequency.

11. A closed loop frequency synthesizer as in claim 10, each of said voltage controllable transconductance inverting amplifiers in said dual port VCO comprising:

a first P-type field effect transistor (PFET) connected between a high supply voltage Vhi and an inverting amplifier output; and an n-type FET (NFET) connected between a low supply voltage and said inverting amplifier output.

12. A closed loop frequency synthesizer as in claim 11, wherein said two pair of voltage controllable transconductance inverting amplifiers further comprise:

a second PFET connected between Vhi and said first PFET, said filtered control voltage being provided to a control gate of said second PFET;

a third and fourth PFET connected in series and between Vhi and said output, said noise difference voltage being provided to a control gate of said fourth PFET; and a VCO phase being connected to a control gate of said NFET, said first PFET and said third PFET.

13. A closed loop frequency synthesizer as in claim 12, wherein said two pair are said first pair and said second pair.

14. A closed loop frequency synthesizer as in claim 12, wherein said two pair are said third pair and said fourth pair.

15. A closed loop frequency synthesizer as in claim 12, wherein said integrator comprises:

a differential amplifier;

a capacitor connected between said differential amplifier output and a negative input to said differential amplifier; and a resistor connected between an input to said integrator and said negative input of said differential amplifier, an output of said differential amplifier being the output of said integrator.

16. A closed loop frequency synthesizer as in claim 12 wherein said integrator comprises:

a comparator comparing said filtered control voltage against a threshold voltage;

an up/down counter receiving an output of said comparator, said up/down counter incrementing or decrementing in response to said comparator output; and a digital to analog converter converting a count output of said up/down counter to an integrator output voltage.

17. A closed loop frequency synthesizer as in claim 12, wherein said loop filter comprises:

a series resistor and capacitor (RC) connected between an output of said charge pump and a reference voltage; and a capacitor in parallel with said series RC.

18. A closed loop frequency synthesizer as in claim 17, wherein said charge pump comprises:

a first current source providing a first current for pumping charge to said loop filter;

a PFET selectively connecting said first current source to said loop filter;

a second current source providing a second current for pumping charge from said loop filter; and a NFET selectively connecting said second current source to said loop filter, whereby said charge pump maintains said filtered control voltage at said loop filter.

* * * * *

UNITED STATES PATENT AND TRADEMARK OFFICE
CERTIFICATE OF CORRECTION

PATENT NO. : 6,990,164 B2 Page 1 of 3
APPLICATION NO. : 09/968178
DATED : January 24, 2006
INVENTOR(S) : Michael L. Bushman It is certified that error appears in the above-identified patent and that said Letters Patent is hereby corrected as shown below:

In Column 9, Line 6, Claim No. 1:
    Change "loop filter filtering" to --a loop filter filtering--

In Column 9, Line(s) 22-24, Claim(s) No. 1 and 2:
    Change "divided frequency.
2. A frequency synthesizer as in claim 1 wherein said dual port VCI comprises:"
to --divided frequency;
wherein said dual port VCO comprises:--

In Column 9, Line 30, Claim No. 2:
    Change "pair of complementary outputs said second pair" to --pair of complementary outputs, said second pair--

In Column 9, Line 45, Claim No. 3:
    Change "3. A frequency synthesizer as in claim 2, wherein two pair" to --2. A frequency synthesizer as in claim 1, wherein two pair--

In Column 9, Line 50, Claim No. 4:
    Change "4. A frequency synthesizer as in claim 3, each of said" to --3. A frequency synthesizer as in claim 2, each of said--

In Column 9, Line 55, Claim No. 4:
    Change "high supply voltage Vhi and an inverting output, said" to --high supply voltage $V_{hi}$ and an inverting output, said--

In Column 9, Line 59, Claim No. 5:
    Change "5. A frequency synthesizer as in claim 4, wherein two" to --4. A frequency synthesizer as in claim 3, wherein two--

Signed and Sealed this

Thirteenth Day of July, 2010

David J. Kappos
*Director of the United States Patent and Trademark Office*

In Column 9, Line 62, Claim No. 5:
Change "a second PFET connected between Vhi and said first" to --a second PFET connected between $V_{hi}$ and said first--

In Column 9, Line 66, Claim No. 5:
Change "Vhi and said output, said noise difference voltage being" to --$V_{hi}$ and said output, said noise difference voltage being--

In Column 10, Line 3, Claim No. 6:
Change "6. A frequency synthesizer as in claim 5 wherein said" to --5. A frequency synthesizer as in claim 4, wherein said--

In Column 10, Line 13, Claim No. 7:
Change "7. A frequency synthesizer as in claim 5 wherein said" to --6. A frequency synthesizer as in claim 4, wherein said--

In Column 10, Line 22, Claim No. 8:
Change "8. A frequency synthesizer as in claim 5 wherein said loop" to --7. A frequency synthesizer as in claim 4, wherein said loop--

In Column 10, Line 27, Claim No. 9:
Change "9. A frequency synthesizer as in claim 8 wherein said" to --8. A frequency synthesizer as in claim 7, wherein said--

In Column 10, Line 38, Claim No. 10:
Change "10. A closed loop frequency synthesizer comprising:" to --9. A closed loop frequency synthesizer comprising:--

In Column 10, Line 49, Claim No. 10:
Change "a first pair of voltage controllable transconductance" to --a first pair of voltage controllable conductance--

In Column 11, Line 13, Claim No. 10:
Change "divider dividing said output frequency" to --divider dividing said frequency output--

In Column 11, Line 17, Claim No. 11:
Change "11. A closed loop frequency synthesizer as in claim 10," to --10. A closed loop frequency synthesizer as in claim 9,--

In Column 11, Line 19, Claim No. 11:
Change "amplifiers in said dual port VCO comprising:" to --amplifiers, in said dual port VCO comprising:--

In Column 11, Line 21, Claim No. 11:
Change "between a high supply voltage Vhi and an inverting" to --between a high supply voltage $V_{hi}$ and an inverting--

CERTIFICATE OF CORRECTION (continued)
U.S. Pat. No. 6,990,164 B2

In Column 11, Line 26, Claim No. 12:
    Change "12. A closed loop frequency synthesizer as in claim 11," to --11. A closed loop frequency synthesizer as in claim 10,--

In Column 11, Line 29, Claim No. 12:
    Change "a second PFET connected between Vhi and said first" to --a second PFET connected between $V_{hi}$ and said first--

In Column 11, Line 33, Claim No. 12:
    Change "Vhi and said output, said noise difference voltage being" to --$V_{hi}$ and said output, said noise difference voltage being--

In Column 11, Line 38, Claim No. 13:
    Change "13. A closed loop frequency synthesizer as in claim 12," to --12. A closed loop frequency synthesizer as in claim 11,--

In Column 11, Line 40, Claim No. 14:
    Change "14. A closed loop frequency synthesizer as in claim 12," to --13. A closed loop frequency synthesizer as in claim 11,--

In Column 12, Line 1, Claim No. 15:
    Change "15. A closed loop frequency synthesizer as in claim 12," to --14. A closed loop frequency synthesizer as in claim 11,--

In Column 12, Line 12, Claim No. 16:
    Change "16. A closed loop frequency synthesizer as in claim 12" to --15. A closed loop frequency synthesizer as in claim 11,--

In Column 12, Line 22, Claim No. 17:
    Change "17. A closed loop frequency synthesizer as in claim 12," to --16. A closed loop frequency synthesizer as in claim 11,--

In Column 12, Line 28, Claim No. 18:
    Change "18. A closed loop frequency synthesizer as in claim 17," to --17. A closed loop frequency synthesizer as in claim 16,--